United States Patent
Chi

(10) Patent No.: US 10,462,951 B2
(45) Date of Patent: Oct. 29, 2019

(54) AUTOMATIC DETECTION DEVICE AND AUTOMATIC DETECTION METHOD FOR TAPE

(71) Applicant: FUJI CORPORATION, Chiryu-shi (JP)

(72) Inventor: Xiao Dong Chi, Nagoya (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/534,796

(22) PCT Filed: Dec. 12, 2014

(86) PCT No.: PCT/JP2014/083041
§ 371 (c)(1),
(2) Date: Jun. 9, 2017

(87) PCT Pub. No.: WO2016/092706
PCT Pub. Date: Jun. 16, 2016

(65) Prior Publication Data
US 2018/0228067 A1 Aug. 9, 2018

(51) Int. Cl.
*H05K 13/08* (2006.01)
*B65H 20/00* (2006.01)
(Continued)

(52) U.S. Cl.
CPC .............. *H05K 13/08* (2013.01); *B65H 20/00* (2013.01); *G01B 11/14* (2013.01); *H05K 13/02* (2013.01);
(Continued)

(58) Field of Classification Search
CPC .... H05K 13/08; H05K 13/02; H05K 13/0417; H05K 2203/163; H05K 13/0015;
(Continued)

(56) References Cited

U.S. PATENT DOCUMENTS

| 2,946,504 A | * | 7/1960 | Muenzer | ............... G06F 7/4985 |
| | | | | 101/93.35 |
| 3,154,233 A | * | 10/1964 | Hubbard | ................... B41J 15/16 |
| | | | | 192/12 D |

(Continued)

FOREIGN PATENT DOCUMENTS

| JP | 2005-539370 A | 12/2005 |
| WO | WO 2013/157108 A1 | 10/2013 |

OTHER PUBLICATIONS

Espacenet Machine translation of Chi (WO 2013/157108).*

(Continued)

*Primary Examiner* — Mohamed K Amara
(74) *Attorney, Agent, or Firm* — Oblon, McClelland, Maier & Neustadt, L.L.P.

(57) ABSTRACT

A control device that determines tape reference positions having a fixed positional relationship with first origin positions based on first positions of tape feeding devices when leading ends of carrier tapes are detected and the first origin positions of the tape feeding devices immediately before leading end detection. Then, after determination of the tape reference positions, an interval between cavities is calculated based on a detection cycle of transmitted light amounts detected by light being transmitted through empty cavities. In addition, when a phenomenon, in which a detected light amount is equal to or smaller than a threshold, consecutively occurs after calculation of the interval between the cavities, it is detected that components are accommodated in the cavities.

9 Claims, 10 Drawing Sheets

(51) Int. Cl.
*G01B 11/14* (2006.01)
*H05K 13/02* (2006.01)

(52) U.S. Cl.
CPC ..... *H05K 13/0215* (2018.08); *H05K 13/0812* (2018.08)

(58) Field of Classification Search
CPC ...... H05K 13/003; B65H 20/00; B65H 20/20; B65H 2511/512; B65H 2515/60; G01B 11/14; G01B 11/02; G01B 21/047; G01B 5/14; G01B 11/00; G01B 11/005; G01B 9/0207; G01B 7/003; G01B 21/04; G01B 2210/44; G01L 321/04; G01L 2210/44; G01N 21/956
See application file for complete search history.

(56) References Cited

U.S. PATENT DOCUMENTS

| | | | | |
|---|---|---|---|---|
| 3,517,921 A * | 6/1970 | Miciukiewicz | ........... | C23F 1/02 271/8.1 |
| 4,229,113 A * | 10/1980 | Anderson | ................ | B41J 11/48 226/115 |
| 4,327,482 A * | 5/1982 | Araki | ................ | H05K 13/0408 228/6.2 |
| 4,610,083 A * | 9/1986 | Campisi | ............. | H05K 13/0417 156/751 |
| 4,810,154 A * | 3/1989 | Klemmer | ........... | H05K 13/0417 414/222.02 |
| 4,997,180 A * | 3/1991 | Ishii | ........................ | B41L 21/02 271/176 |
| 5,024,720 A * | 6/1991 | Boss | ................. | H05K 13/0417 156/702 |
| 5,158,221 A * | 10/1992 | Hashimoto | ............ | B65H 20/20 226/110 |
| 5,172,003 A * | 12/1992 | Nasu | ........................ | B65H 7/14 250/216 |
| 5,191,693 A * | 3/1993 | Umetsu | ................. | B23P 19/001 156/324 |
| 5,279,453 A * | 1/1994 | Hashimoto | ........ | B65H 23/1882 226/109 |
| 5,294,290 A * | 3/1994 | Reeb | .................. | G06K 19/0672 101/483 |
| 5,335,837 A * | 8/1994 | Saeki | ..................... | B65H 20/20 226/101 |
| 5,349,199 A * | 9/1994 | Rabjohns | ................. | B65H 7/14 250/222.1 |
| 5,725,140 A * | 3/1998 | Weber | .................. | B65H 37/002 226/128 |
| 5,831,741 A * | 11/1998 | Milillo | ..................... | B65H 9/20 356/429 |
| 6,032,845 A * | 3/2000 | Piccone | ................. | B65H 20/22 198/832.1 |
| 6,157,870 A * | 12/2000 | Gfeller | .................. | B23P 19/001 221/73 |
| 6,196,783 B1 * | 3/2001 | Foster | .................... | B65H 20/22 156/751 |
| 6,269,860 B1 * | 8/2001 | Ishikawa | ............ | H05K 13/0417 156/701 |
| 6,694,606 B1 * | 2/2004 | Ohashi | ................. | H05K 13/003 226/128 |
| 7,472,737 B1 * | 1/2009 | Rachkov | .................. | G03B 1/24 156/539 |
| 7,502,666 B2 * | 3/2009 | Siegel | ................. | G06F 19/3462 700/244 |
| 7,866,518 B2 * | 1/2011 | Wada | ................. | H05K 13/0417 226/128 |
| 8,414,244 B2 * | 4/2013 | Fritschy | ............. | H05K 13/0417 414/332 |
| 8,633,616 B2 * | 1/2014 | Soar | ........................ | B60N 2/24 307/104 |
| 9,271,417 B2 * | 2/2016 | Kawaguchi | .......... | H05K 13/021 |
| 9,314,764 B2 * | 4/2016 | Hess | .................... | B01J 19/0046 |
| 9,656,495 B2 * | 5/2017 | Noda | ..................... | B41J 15/044 |
| 9,820,420 B2 * | 11/2017 | Ohyama | ........... | H05K 13/0417 |
| 9,968,019 B2 * | 5/2018 | Tanokuchi | ............... | B65H 5/28 |
| 10,000,352 B2 * | 6/2018 | Matsumori | ........ | B65H 20/20 |
| 2001/0040117 A1 * | 11/2001 | Easton | ............... | H05K 13/0417 206/714 |
| 2003/0044189 A1 * | 3/2003 | Okitsu | .................. | B41J 11/009 399/45 |
| 2003/0219330 A1 | 11/2003 | Lyndaker et al. | | |
| 2012/0080550 A1 * | 4/2012 | Yamaguchi | ........... | B41J 3/4075 242/160.4 |
| 2015/0053809 A1 | 2/2015 | Chi | | |
| 2016/0124363 A1 * | 5/2016 | Takahashi | .......... | G03G 15/5029 399/45 |

OTHER PUBLICATIONS

International Search Report dated Feb. 3, 2015 in PCT/JP2014/083041 filed Dec. 12, 2014.
Extended European Search Report dated Jul. 25, 2018 in Patent Application No. 14908006.1 9 pages.

* cited by examiner

US 10,462,951 B2

AUTOMATIC DETECTION DEVICE AND AUTOMATIC DETECTION METHOD FOR TAPE

TECHNICAL FIELD

The present application relates to an automatic detection device and automatic detection method for tape that can automatically detect information of the tape.

BACKGROUND ART

For example, a tape feeder that can automatically load a tape in which cavities for accommodating components are provided at a regular interval is disclosed in PTL 1. This automatic loading is performed by multiple optical sensors detecting a pitch between adjacent cavities and presence or absence of a component in a cavity as information of the tape.

CITATION LIST

Patent Literature

PTL 1: JP-T-2005-539370

SUMMARY

The device disclosed in PTL 1 tends to have a complicated configuration since the tape is required to be detected by the multiple optical sensors. For this reason, a device that can automatically detect information of tape with a simpler configuration has been called for.

The disclosure is made in view of the circumstances, and an object thereof is to provide an automatic detection device and automatic detection method for tape that can automatically detect information of the tape with a simpler configuration.

To solve the aforementioned problems, an automatic detection device for tape of the disclosure includes a tape feeding mechanism that feeds the tape, in which cavities for component accommodation are provided at a regular interval and which has multiple empty cavities on a leading end side, at a predetermined pitch, the tape feeding mechanism having multiple origin positions at an interval which is equal to or larger than the predetermined pitch, an origin position detector configured to detect each of the multiple origin positions of the tape feeding mechanism, a light amount detector configured to transmit light through the tape and detect a transmitted light amount, a leading end detection section configured to detect a leading end of the tape fed by the tape feeding mechanism based on a detected light amount from the light amount detector, a reference position determination section configured to determine a tape reference position, which is in a fixed positional relationship with a first origin position, based on a first position of the tape feeding mechanism when the leading end detection section detects the leading end of the tape and the first origin position of the tape feeding mechanism immediately before leading end detection by the leading end detection section, and an interval calculating section configured to calculate an interval between the cavities based on a detection cycle of the empty cavities by the light amount detector after the reference position determination section determines the tape reference position.

In the automatic detection device for tape, the interval between the cavities can be simply acquired since the tape reference position, which is in a fixed positional relationship with the first origin position of the tape feeding mechanism, is determined and then the interval between the cavities is calculated by detecting the light amount. Therefore, the cycle time of, for example, an automatic splicing device or an automatic tape setting device, to which the automatic detection device for tape is applied, is reduced and production efficiency is improved.

In addition, an automatic detection method for a tape of the disclosure includes a tape feeding step of feeding a tape, in which cavities for component accommodation are provided at a regular interval and which has multiple empty cavities on a leading end side, by a tape feeding mechanism that has multiple origin positions at an interval of a predetermined pitch, at a pitch which is equal to or smaller than the predetermined pitch, a leading end detecting step of detecting a leading end of the tape fed by the tape feeding mechanism based on a transmitted light amount detected by light being transmitted though the tape, a reference position determining step of determining a tape reference position, which is in a fixed positional relationship with a first origin position, based on a first position of the tape feeding mechanism when a leading end of the tape is detected in the leading end detecting step and the first origin position of the tape feeding mechanism immediately before leading end detection in the leading end detecting step, and an interval calculating step of calculating an interval between the cavities based on a detection cycle of transmitted light amounts detected by the light being transmitted through the empty cavities after the tape reference position is determined in the reference position determining step. According to the automatic detection method for the tape, the same effects as the effects of the aforementioned automatic detection device for tape are achieved.

DESCRIPTION OF EMBODIMENTS

Apparatus to which Automatic Detection Device for Tape is Applied

An automatic detection device for tape of the present embodiment is a device that can automatically detect information of a carrier tape, in which cavities for component accommodation are provided at a regular interval, that is, presence or absence of the carrier tape, a pitch (interval) between adjacent cavities, and presence or absence of a component in a cavity. An automatic splicing device is an example of an apparatus to which the automatic detection device for tape is applied. The automatic splicing device is an apparatus that automatically connects the tail end portion of a carrier tape wound around a current reel which is mounted on a tape feeder mounted on a component supply device of a component mounting machine to the starting end portion of a carrier tape wound around the next reel to be replaced with.

Configurations of Carrier Tape and Tape Feeder

Figure 3A:
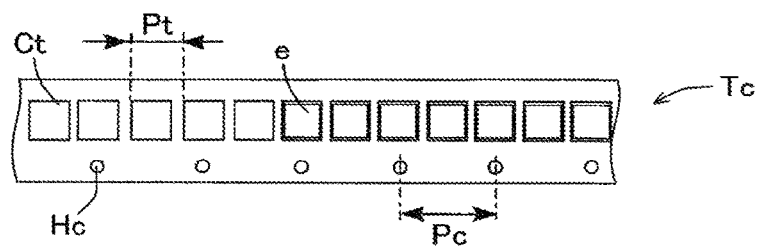
FIG. 3A is a plan view illustrating a carrier tape to be spliced.
Figure 3B:
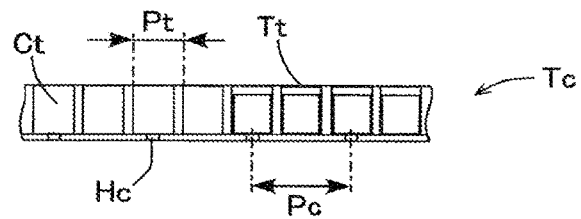
FIG. 3B is a view seen from a side of the carrier tape illustrated in FIG. 3A.

First, the carrier tape and the tape feeder will be described. As illustrated in FIGS. 3A and 3B, carrier tape Tc is formed in an elongated shape having a predetermined width, and multiple cavities Ct are formed at a predetermined pitch Pt in a longitudinal direction. Each of components e to be mounted on a circuit board are accommodated in the cavities Ct. Upper portions of the cavities Ct are open and are covered with a top tape Tt that is attached to the outer surface of the carrier tape Tc. On one end side in a width direction of the carrier tape Tc, feeding holes Hc are formed at regular pitches Pc in the longitudinal direction. In the embodiment, a carrier tape having a portion in which multiple empty cavities Ct that do not accommodate components e are consecutively provided on a leading end side is used as carrier tape Tc.

Figure 3C:
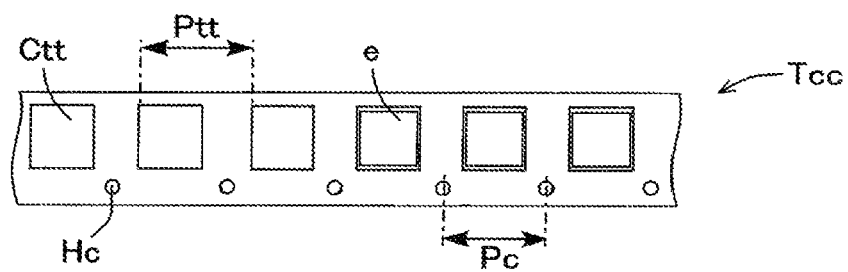
FIG. 3C is a plan view illustrating a different type of a carrier tape to be spliced.

In carrier tape Tc, pitches Pc and sizes of the feeding holes Hc are the same although pitches Pt and sizes of cavities Ct vary according to the sizes of the components e. Cavities Ct and feeding holes Hc are disposed so as to have a fixed positional relationship, and cavities Ct are formed at predetermined pitch Pt (=Pc/2) in carrier tape Tc illustrated in FIGS. 3A and 3B such that one cavity Ct exists at each of positions that are the same as the positions of the feeding holes Hc and at midway positions between adjacent feeding holes Hc. In addition, cavities Ctt are formed at a predetermined pitch Ptt (=Pc) in a carrier tape Tcc illustrated in FIG. 3C such that one cavity Ctt exists at each midway position between adjacent feeding holes Hc.

Figure 4:
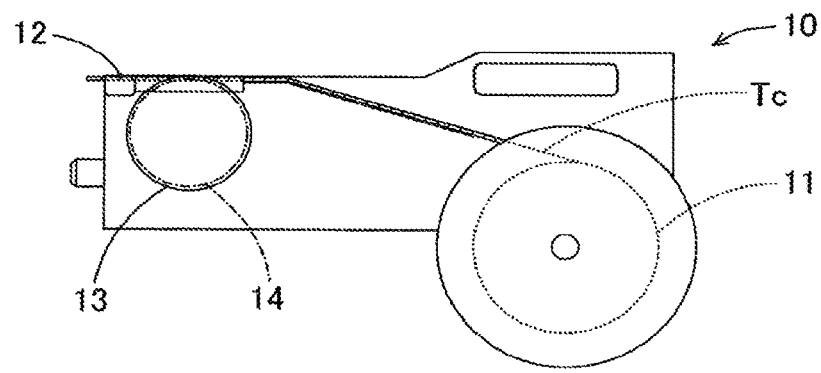
FIG. 4 is a view illustrating a tape feeder, to which a reel wound with carrier tape is detachably attached.

As illustrated in FIG. 4, reel 11 around which carrier tape Tc is wound is detachably attached to tape feeder 10. Tape feeding mechanism 13 that feeds carrier tape Tc wound around reel 11 by a fixed amount to supply the components e one by one to component supply position 12, which is on a leading end portion of tape feeder 10, is provided in tape feeder 10. Tape feeding mechanism 13 is provided with sprocket 14 that is rotatably supported by a main body of tape feeder 10 and that engages with feeding holes Hc of carrier tape Tc, and a motor (not illustrated) that rotates sprocket 14.

Configuration of Automatic Splicing Device

Figure 1:
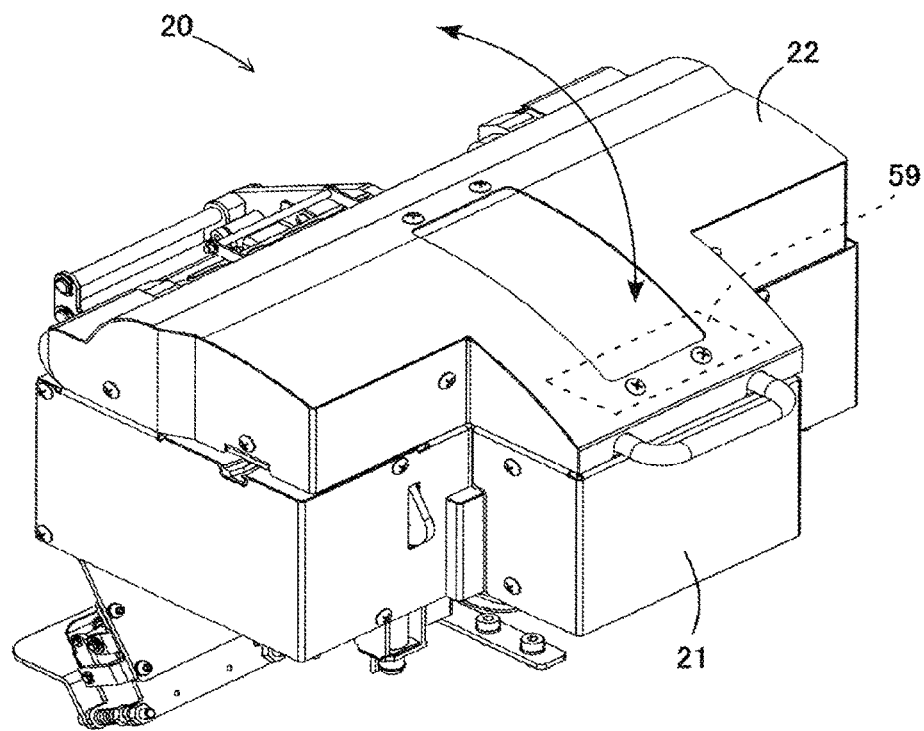
FIG. 1 is a perspective view illustrating an entire automatic splicing device to which an automatic detection device for tape of the embodiment is applied.

Next, the automatic splicing device will be described. As illustrated in FIG. 1, automatic splicing device 20 is provided with box-shaped housing 21 and cover 22, which is an upper face of housing 21 that is openable and closable in an up-down direction (illustrated arrow direction). Automatic splicing device 20 is configured so as to be placed on a wheeled table (not illustrated) and to be movable between feeders mounted on the component supply device of the component mounting machine. Cover 22 is closed during splicing and is opened during picking up of carrier tape Tc after splicing.

Figure 2:
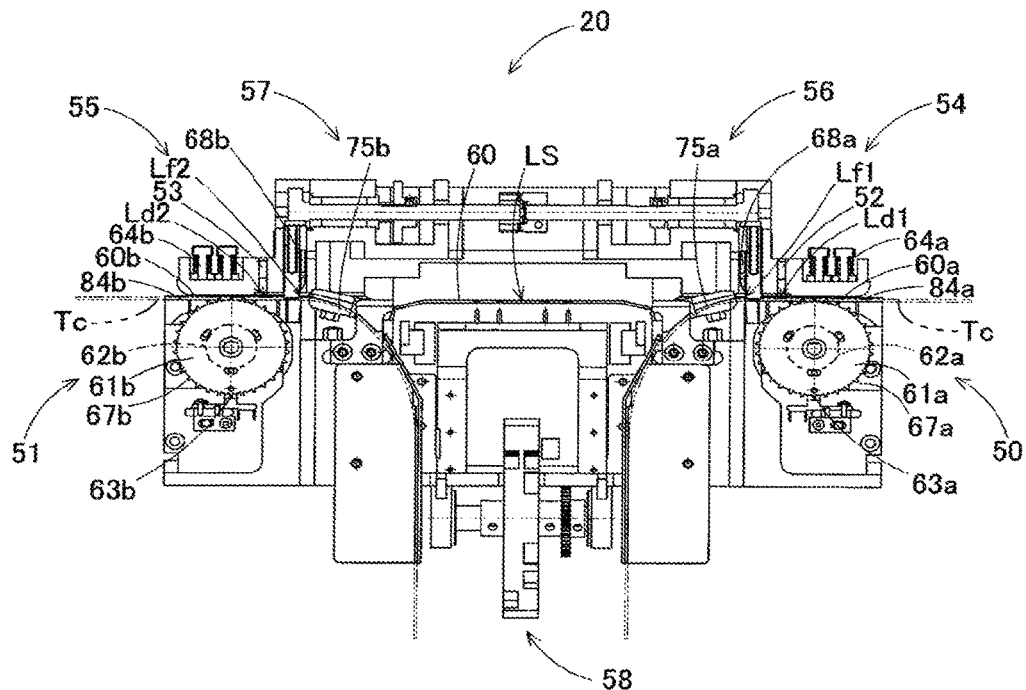
FIG. 2 is a front view illustrating an internal structure of the automatic splicing device.

As illustrated in FIG. 2, first and second tape feeding devices 50 and 51, first and second origin position detection devices 63a and 63b, first and second light amount detection devices 52 and 53, first and second cutting devices 54 and 55, first and second fetching devices 56 and 57, bonding device 58, and control device 59 (refer to FIG. 1) are disposed in housing 21 of automatic splicing device 20.

Figure 5:
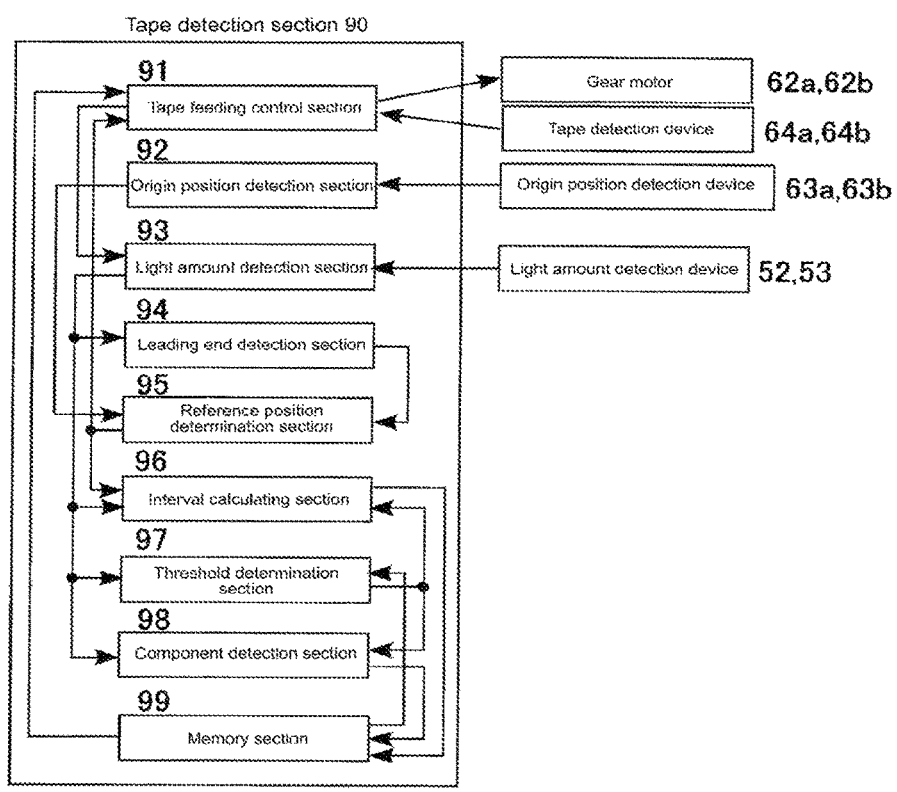
FIG. 5 is a diagram illustrating a control device of the automatic splicing device.

The automatic detection device for tape of the embodiment is configured with the first and second tape feeding devices 50 and 51 (tape feeding mechanism), the first and second origin position detection devices 63a and 63b (origin position detector), the first and second light amount detection devices 52 and 53 (light amount detector), control device 59 (leading end detection section 94, reference position determination section 95, interval calculating section 96, threshold determination section 97, and component detection section 98 illustrated in FIG. 5).

The first and second tape feeding devices 50 and 51 are disposed both in housing 21 and in cover 22, respectively. The first and second origin position detection devices 63a and 63b are disposed below first and second sprockets 61a and 61b, which will be described later, of the first and second tape feeding devices 50 and 51, respectively, and the first and second light amount detection devices 52 and 53 are disposed so as to vertically oppose the first and second origin position detection devices 63a and 63b, respectively, with first and second detection positions Ld1 and Ld2 on first and second conveyance paths 60a and 60b, which will be described later, of the first and second tape feeding devices 50 and 51 being interposed.

In addition, the first and second cutting devices 54 and 55 are disposed at first and second cutting positions Lf1 and Lf2, respectively, between the first and second tape feeding devices 50 and 51. The first and second fetching devices 56 and 57 are disposed between the first and second cutting devices 54 and 55, that is, between the first cutting position Lf1 and a splicing position LS and between the second cutting position Lf2 and the splicing position LS, respectively. Bonding device 58 is disposed between the first and second fetching devices 56 and 57.

The first and second tape feeding devices 50 and 51 are provided with the first and second conveyance paths 60a and 60b provided so as to extend in a horizontal direction toward the middle from both side faces of housing 21, the first and second sprockets 61a and 61b disposed below the first and second conveyance paths 60a and 60b, first and second gear motors 62a and 62b concatenated with the first and second sprockets 61a and 61b, and first and second tape detection devices 64a and 64b disposed above the first and second conveyance paths 60a and 60b.

The first and second cutting devices 54 and 55 are provided with first and second cutters 68a and 68b provided at the first and second cutting positions Lf1 and Lf2 and a vertical movement mechanism (not illustrated) that vertically moves the first and second cutters 68a and 68b. The first and second cutting devices 54 and 55 are configured so as to be capable of cutting unnecessary portions in cut portions of carrier tapes Tc.

The first and second fetching devices 56 and 57 are provided with first and second fetching members 75a and 75b, which are provided between the first cutting position Lf1 and the splicing position LS and between the second cutting position Lf2 and the splicing position LS, and a driving mechanism (not illustrated) that drives the first and second fetching members 75a and 75b. Each of the first and second fetching devices 56 and 57 are configured so as to be capable of fetching a cut unnecessary portion of carrier tape Tc.

Bonding device 58 is provided between the first cutting device 54 and the second cutting device 55, and the conveyance path 60 that makes a part of the first and second conveyance paths 60a and 60b is formed. Bonding device 58 is configured so as to be capable of connecting carrier tapes Tc, of which cut portions are conveyed along conveyance path 60 and are confronted with bonding device 58 at splicing position LS in the middle of conveyance path 60.

In automatic splicing device 20, each of two carrier tapes Tc to be spliced are fed at a predetermined pitch from the first and second tape feeding devices 50 and 51 at the right and left of FIG. 2. In the automatic detection device for tape, information of each carrier tape Tc, that is, presence or absence of the carrier tapes Tc, a pitch Pt between adjacent cavities Ct (hereinafter, referred to as a pitch Pt of a cavity Ct), presence or absence of a component e in a cavity Ct (referred to as a cavity Ct accommodating a component and an empty cavity Ct) are detected.

Then, portions where multiple empty cavities Ct are consecutively provided on the leading end side are cut by the first and second cutters 68a and 68b of the first and second cutting devices 54 and 55, respectively, and portions of the cut empty cavities Ct are fetched by the first and second fetching members 75a and 75b of the first and second fetching devices 56 and 57, respectively. Then, a protective tape, to which a splicing tape (not illustrated) to connect the two carrier tapes Tc is attached, is fed in a direction orthogonal to feeding directions of the carrier tapes Tc, and cut end portions of the two carrier tapes Tc are connected to each other by the bonding device 58 with the splicing tape.

Configuration of Automatic Detection Device for Tape

Next, the automatic detection device for tape of the embodiment in automatic splicing device 20 will be described in detail. As illustrated in FIG. 2, the first and second conveyance paths 60a and 60b of the first and second tape feeding devices 50 and 51 have widths slightly larger than the widths of the carrier tapes Tc, and grooves that extend in straight lines are formed from first and second tape entrances 84a and 84b provided on the both side faces of housing 21 to the first and second cutting positions Lf1 and Lf2 of carrier tapes Tc to be cut by the first and second cutters 68a and 68b, which will be described later, of the first and second cutting devices 54 and 55.

Figure 7:
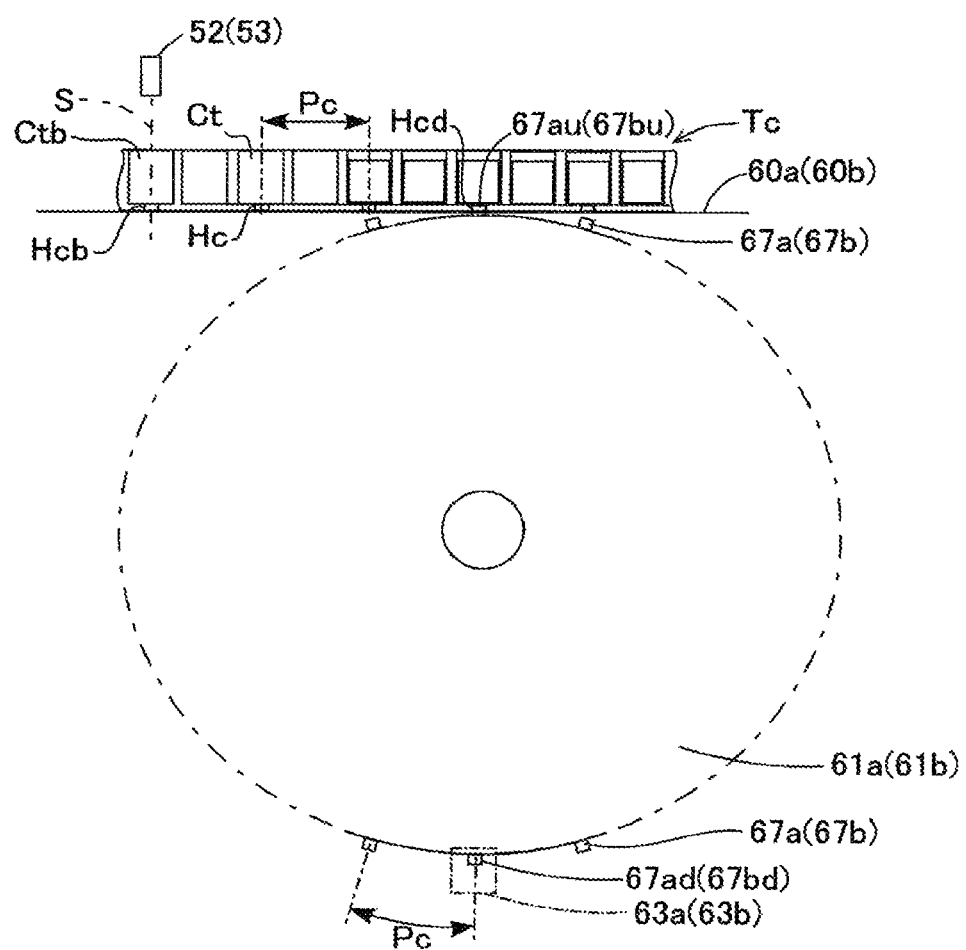
FIG. 7 is a view illustrating the arrangement of first and second sprockets, first and second origin position detection devices, and first and second light amount detection devices and a feeding state of the carrier tape.

As illustrated in FIG. 7, on the circumferences of the first and second sprockets 61a and 61b, multiple first and second teeth 67a and 67b are formed at the same pitches as the pitches Pc of the feeding holes Hc of the carrier tape Tc. In the embodiment, the first and second teeth 67a and 67b are formed at intervals that are equal to or larger than feeding pitches of carrier tape Tc. The first and second sprockets 61a and 61b are disposed below the first and second conveyance paths 60a and 60b such that out of the rotating first and second teeth 67a and 67b, first and second teeth 67au and 67bu that have come to an uppermost portion while rotating can be fitted into the feeding holes Hcd of the carrier tapes Tc that have come along the first and second conveyance paths 60a and 60b while being inserted.

As illustrated in FIG. 2, the first and second gear motors 62a and 62b are, for example, stepping motors, and are motors that feed carrier tapes Tc at a predetermined pitch by the concatenated first and second sprockets 61a and 61b and that can control the positions of the cut portions of carrier tapes Tc. The first and second tape detection devices 64a and 64b are, for example, touch sensors, and are sensors which detect that the carrier tapes Tc are inserted from the first and second tape entrances 84a and 84b provided on the both side faces of housing 21 by coming into contact with the carrier tapes Tc.

The first and second origin position detection devices 63a and 63b are, for example, photosensors, and are sensors that detect one first tooth 67a and one second tooth 67b, out of the multiple first and second teeth 67a and 67b of the first and second sprockets 61a and 62b, by sensor light being blocked by teeth 67a and 67b. Although details will be described later, the positions of the multiple first and second teeth 67a and 67b of the first and second sprockets 61a and 61b are defined as the origin positions of the first and second tape feeding devices 50 and 51, respectively, in the embodiment. Therefore, the first and second origin position detection devices 63a and 63b are sensors that detect each of the multiple origin positions of the first and second tape feeding devices 50 and 51.

As illustrated in FIG. 7, the first and second origin position detection devices 63a and 63b are disposed such that the first and second teeth 67au and 67bu that have come to the uppermost portion while rotating, out of the rotating first and second teeth 67a and 67b, are fitted into the feeding holes Hcd of the carrier tapes Tc that have come along the first and second conveyance paths 60a and 60b while being inserted when first and second teeth 67ad and 67bd (origin positions) that have come to a lowermost portion while rotating, out of the rotating first and second teeth 67a and 67b, are detected.

As illustrated in FIG. 2, the first and second light amount detection devices 52 and 53 are, for example, photosensors, and are sensors that detect transmitted light amounts of cavities Ct of carrier tapes Tc fed by the first and second sprockets 61a and 62b. The light amounts detected by the first and second light amount detection devices 52 and 53 are maximum values Lmax when not blocked by carrier tapes Tc, that is, in a saturated state. The light amounts vary according to the type of carrier tape Tc when it comes to the empty cavities Ct. The light amounts are values smaller than a predetermined value La when it comes to the empty cavities Ct of the carrier tape Tc illustrated in FIGS. 3A and 3B and are values larger than the predetermined value La when it comes to the empty cavities Ctt of the carrier tape Tcc illustrated in FIG. 3C.

In addition, although light is blocked by tape portions between adjacent cavities Ct and cavities Ct accommodating the components, a threshold of a light amount is set according to the type of carrier tape Tc and determination is made. In other words, a value Lb smaller than the predetermined value La is set as a threshold for carrier tape Tc illustrated in FIGS. 3A and 3B, and when a detected light amount is smaller than the threshold Lb (<La), it is determined to be tape portions and cavities Ct accommodating components. The predetermined value La is set as a threshold for carrier tape Tcc Illustrated in FIG. 3C, and when a detected light amount is smaller than the threshold La, it is determined to be tape portions and cavities Ctt accommodating components.

Herein, as illustrated in FIG. 7, the first and second light amount detection devices 52 and 53 (positions of sensor light axes S) are disposed at detection positions where cavities Ctb formed at the same positions as those of the feeding holes Hob of the carrier tapes Tc are positioned, that is, transmitted light amounts of the cavities Ctb are detected, when the first and second teeth 67ad and 67bd (origin positions) of the first and second sprockets 61a and 62b are detected by the first and second origin position detection devices 63a and 63b.

In the embodiment, since the positions of the feeding holes Hcb, which are at the same positions of the cavities Ctb detected by the first and second light amount detection devices 52 and 53, are defined as tape reference positions of carrier tapes Tc (positions of the feeding holes Hcb), the origin positions of the first and second tape feeding devices 50 and 51 (positions of the first and second teeth 67ad and 67bd) are in a fixed positional relationship with the tape reference positions of carrier tape Tc (positions of the feeding holes Hcb).

As illustrated in FIG. 5, tape detection section 90 of control device 59 is provided with tape feeding control section 91, origin position detection section 92, light amount detection section 93, leading end detection section 94, reference position determination section 95, interval calculating section 96, threshold determination section 97, component detection section 98, and memory section 99.

Tape feeding control section 91 rotation-drives the first and second gear motors 62a and 62b of the first and second tape feeding devices 50 and 51 such that carrier tape Tc is fed by an amount that is equal to or smaller than the pitch Pc of the cavity Ct, for example, by a feeding amount of Pc/4, which is one fourth of the pitch Pc, when detection signals of carrier tape Tc are input from the first and second tape detection devices 64a and 64b. Then, the first and second gear motors 62a and 62b are rotation-driven such that the carrier tapes Tc are fed at a faster speed than the beginning, for example, by a feeding amount of Pc/2, which is one half of the pitch Pc, when determination signals of the tape reference positions are input from reference position determination section 95. In addition, the first and second gear motors 62a and 62b are rotation-driven and are stopped being rotation-driven based on the initial positions of the cavities Ct accommodating the components and the pitch Pc of the cavity Ct read from the memory section 99.

Origin position detection section 92 inputs detection signals of the origin positions of the first and second tape feeding devices 50 and 51 input from the first and second origin position detection devices 63a and 63b into the reference position determination section 95. When a pitch-feeding signal of carrier tape Tc is input from tape feeding control section 91, light amount detection section 93 inputs detection signals of light amounts from the first and second light amount detection devices 52 and 53 for each pitch-feeding, and inputs the detection signals into leading end detection section 94, interval calculating section 96, threshold determination section 97, and component detection section 98. Leading end detection section 94 detects leading ends of the carrier tapes Tc fed by the first and second tape feeding devices 50 and 51 based on the detection signals of the light amounts input from light amount detection section 93 and inputs the detection signals into reference position determination section 95.

Although details will be described later, reference position determination section 95 determines, based on the first positions of the first and second tape feeding devices 50 and 51 when the detection signals of the leading ends of the carrier tapes Tc are input from the leading end detection section 94 and the first origin positions of the first and second tape feeding devices 50 and 51 immediately before leading end detection by leading end detection section 94, tape reference positions which are in a fixed positional relationship with the first origin positions, and inputs the determination signals into tape feeding control section 91 and interval calculating section 96.

Herein, determination operation for a tape reference position based on the first positions and the first origin positions will be described with reference to FIGS. 8 to 10. Since the same determination operation for the tape reference position is applied with respect to carrier tapes Tc inserted from both sides of automatic splicing device 20, determination operation for the tape reference position with respect to carrier tape Tc illustrated in FIGS. 3A and 3B, which is inserted from the right of FIG. 2, will be described. In addition, in the embodiment, a tape leading end Th of carrier tape Tc is set as a tape portion between cavity Ct of feeding hole Ho indicated by a virtual line (one dot chain line) and cavity Ct adjacent to the cavity Ct as illustrated in FIG. 8.

Figure 8:
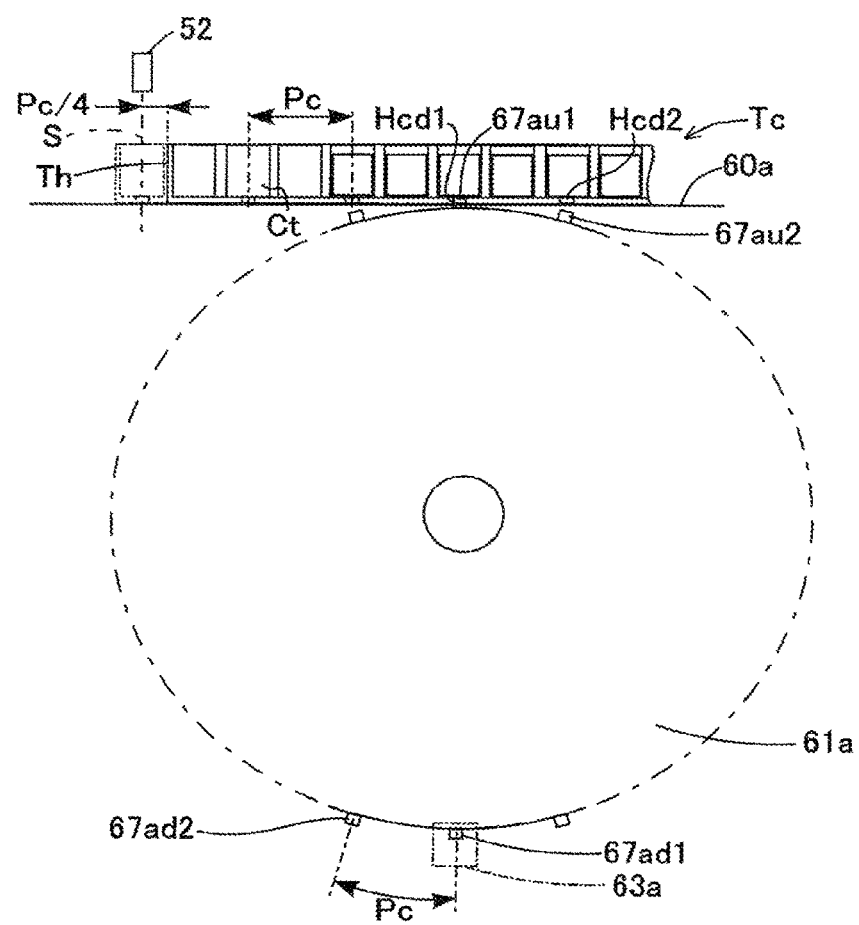
FIG. 8 is a view illustrating a detection state of a first origin position of the first tape feeding device immediately before leading end detection and illustrating the first sprocket and the carrier tape in this state.

FIG. 8 illustrates a detection state of a first origin position immediately before leading end detection of carrier tape Tc. In this state, the position of the tape leading end Th of carrier tape Tc when a first tooth 67ad1 on the lowermost portion of first sprocket 61a is detected by first origin position detection device 63a, that is, when first tooth 67au 1 on the uppermost portion of first sprocket 61a is fitted into feeding hole Hcd1 of carrier tape Tc is separated from the detection position of first light amount detection device 52 (position of the sensor light axis S) by one fourth of the pitch (Pc/4) to the upstream side. Description will be given below with reference sign 67ad1 being assigned to first tooth 67a which is detected next to first tooth 67ad1 and reference sign 67au 1 being assigned to a first tooth 67a which is fitted into feeding hole Hcd2 next to first tooth 67au 1.

Figure 9:
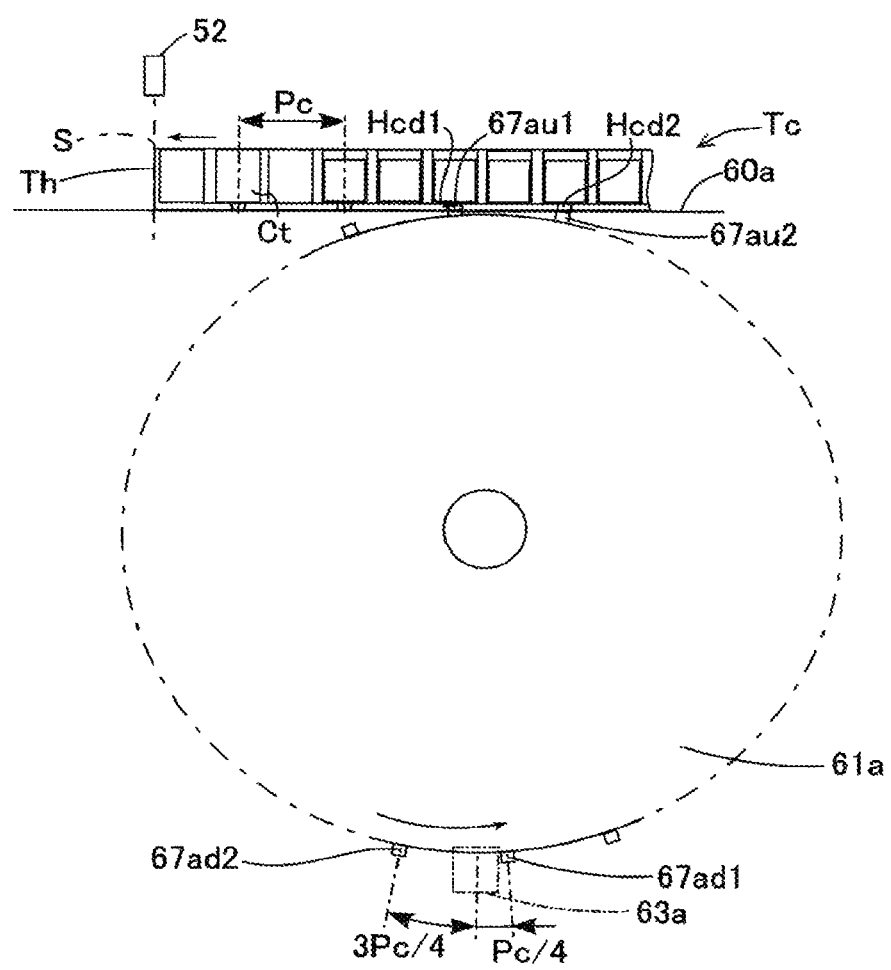
FIG. 9 is a view illustrating a leading end detection state and illustrating the first sprocket and the carrier tape in this state.

FIG. 9 illustrates a leading end detection state of carrier tape Tc. In other words, a state where first sprocket 61a rotates by a distance of Pc/4, from a state of the detection of the first origin position in FIG. 8 (first tooth 67ad1 is detected), carrier tape Tc goes forward by a distance of Pc/4, and the tape leading end Th reaches the detection position of first light amount detection device 52 (position of the sensor light axis S) is illustrated. The position of first tooth 67ad1 at this time is set as the first position.

The reference position determination section 95 acquires a feeding amount of the carrier tape Tc from the first origin position to the first position, that is, a distance of Pc/4, based on the first origin position, that is, a position at which the first tooth 67ad1 is detected by the first origin position detection device 63a, and the first position, that is, a position at which the first tooth 67ad1 is rotated by a distance of Pc/4 after being detected by the first origin position detection device 63a. Then, a difference between an interval with an adjacent origin position, that is, a distance of Pc, and the feeding amount of carrier tape Tc from the first origin position to the first position, that is, a distance of Pc/4, that is, a distance 3Pc/4 are acquired. Then, when carrier tape Tc is fed by the acquired distance 3Pc/4 from the state of FIG. 9, the position of feeding hole Hc, which is at the same position as that of the cavity Ct of the carrier tape Tc positioned at the detection position of the first light amount detection device 52 (position of the sensor light axis S) is determined as a tape reference position, which is in a fixed relationship with the first origin position.

Figure 10:
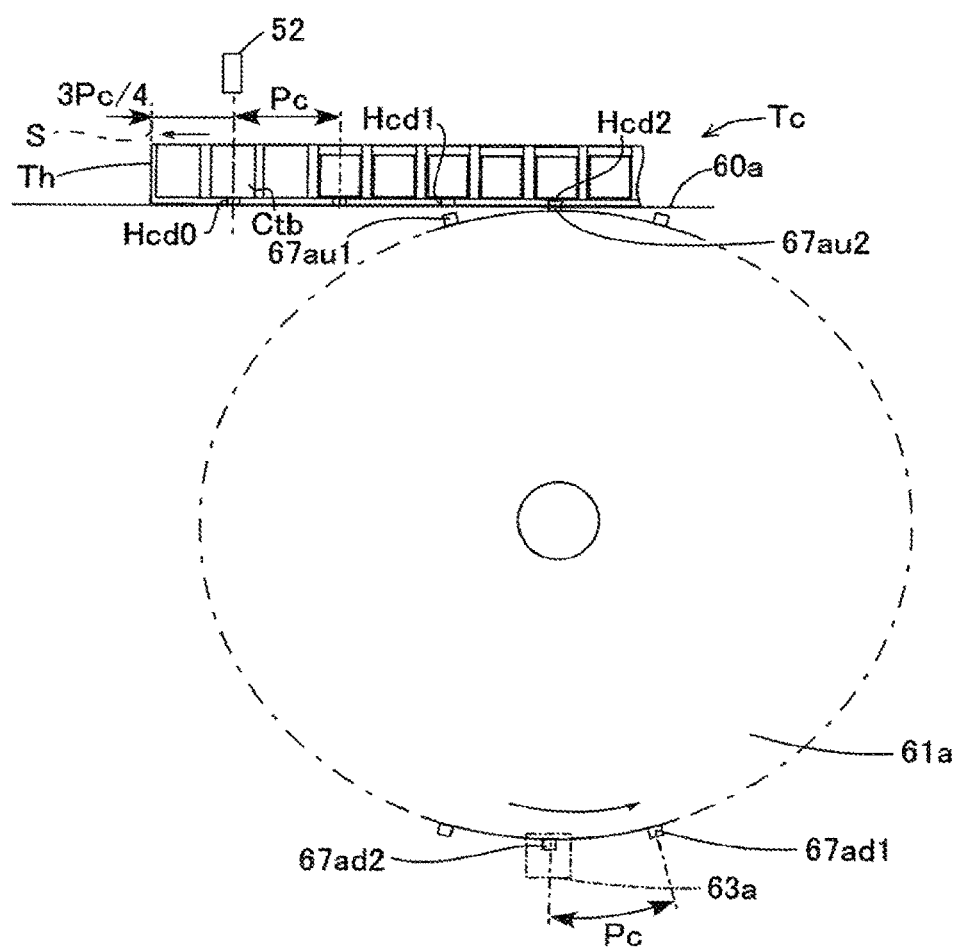
FIG. 10 is a view illustrating a detection state of an origin position of the first tape feeding device immediately after leading end detection and illustrating the first sprocket and the carrier tape in this state.

FIG. 10 illustrates a state where the carrier tape Tc is positioned at the tape reference position. This state indicates a detection state of the origin position immediately after leading end detection of carrier tape Tc, in which first tooth 67ad2 that has come to the lowermost portion while rotating next to first tooth 67ad1 of first sprocket 61a is detected by first origin position detection device 63a, and first tooth 67au 2 that has come to the uppermost portion while rotating next to first tooth 67au 1 of first sprocket 61a is fitted into feeding hole Hcd2, which is fed next to feeding hole Hcl1 of carrier tape Tc. The position of the tape leading end Th of carrier tape Tc at this time is separated from the detection position of first light amount detection device 52 (position of the sensor light axis S) by three fourths pitches (3Pc/4) to the downstream side. Therefore, the tape reference position is the position of feeding hole Hcd0, which is formed at the same position as that of cavity Ctb positioned at the detection position of first light amount detection device 52 (position of the sensor light axis S).

After a determination signal of the reference position of carrier tape Tc is input from reference position determination section 95, interval calculating section 96 detects the empty cavities Ct of carrier tape Tc based on detected light amounts input from light amount detection section 93 and a threshold input from threshold determination section 97, calculates the pitch Pc of the cavity Ct based on the detection cycle, and stores the pitch Pc in the memory section 99.

Based on the detected light amounts input from light amount detection section 93, threshold determination section 97 determines a predetermined threshold for distinguishing the empty cavities Ct stored in advance in memory section 99 from the tape portions (portions between adjacent cavities Ct) and cavities Ct accommodating the components. After a calculation signal of the pitch Pc of cavity Ct is input from interval calculating section 96, component detection section 98 detects the cavities Ct accommodating the components of carrier tape Tc based on the detected light amounts input from light amount detection section 93 and threshold input from the threshold determination section 97, and stores the initial positions of the cavities Ct accommodating the components in memory section 99.

Multiple thresholds of light amounts for distinguishing the empty cavities Ct from the tape portions (portions between adjacent cavities Ct) and the cavities Ct accommodating the components are stored in advance in memory section 99. That is, the threshold Lb (<Lc) that is used in a case where the light amounts of the empty cavities Ct detected by the first and second light amount detection devices 52 and 53 are Lc (in the case of carrier tape Tc) and the threshold La (<Lcc) that is used in a case where the light amounts of the empty cavities Ctt are Lcc (in the case of the carrier tape Tcc) are stored in advance. In addition, memory section 99 stores the pitch Pc of the cavity Ct input from interval calculating section 96 and the initial positions of the cavities Ct accommodating the components input from component detection section 98.

Automatic Detection Operation for Tape

Next, automatic detection operation for tape in automatic splicing device 20 will be described with reference to the flowchart of FIG. 6. Since the same automatic detection operation is applied with respect to carrier tapes Tc inserted from both sides of automatic splicing device 20, automatic detection operation with respect to the carrier tape Tc, which is illustrated in FIGS. 3A and 3B and is inserted from the right of FIG. 2, will be described below.

Figure 6:
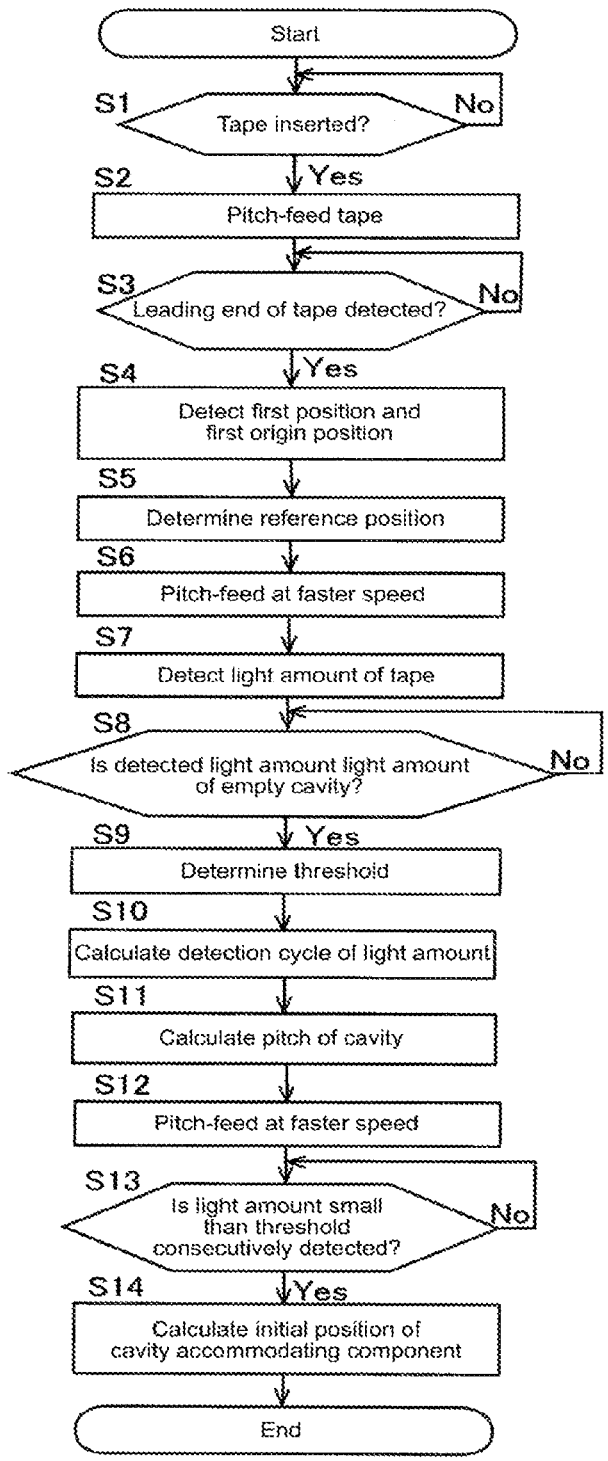
FIG. 6 is a flowchart for describing automatic detection operation for a tape in the automatic splicing device.

Control device 59 checks whether carrier tape Tc is inserted from first tape entrance 84a (Step S1 of FIG. 6), and when carrier tape Tc is inserted from first tape entrance 84a, first sprocket 61a is started to be rotation-driven and carrier tape Tc is pitch-fed (step S2 of FIG. 6).

Specifically, tape feeding control section 91 rotation-drives first gear motor 62a and feeds carrier tape Tc by a feeding amount that is equal to or smaller than the pitch Pc of the cavity Ct, for example, by a feeding amount of Pc/4, which is one fourth of the pitch Pc, when a detection signal of carrier tape Tc is input from first tape detection device 64a.

The control device 59 checks whether or not the leading end of the carrier tape Tc is detected (Step S3 of FIG. 6), and when the leading end of carrier tape Tc is detected, the first position of first tape feeding device 50 and the first origin position of first tape feeding device 50 immediately before leading end detection are detected (Step S4 of FIG. 6). Then, control device 59 determines the tape reference position of the carrier tape Tc based on the detected first position and first origin position (step S5 of FIG. 6).

Specifically, when a pitch-feeding signal of carrier tape Tc is input from tape feeding control section 91, light amount detection section 93 inputs a detection signal of a light amount from first light amount detection device 52 for each pitch-feeding, and inputs the detection signal into leading end detection section 94. Leading end detection section 94 inputs the detection signal of the leading end of carrier tape Tc into reference position determination section 95 when the detected light amount from light amount detection section 93 is a minimum value Lmin.

Based on the first position of first tape feeding device 50 when the leading end detection signal is input, the first origin position of first tape feeding device 50 immediately before leading end detection, the feeding amount of carrier tape Tc from the first origin position to the first position, and the interval with the adjacent origin position, reference position determination section 95 determines a tape reference position, and inputs a determination signal into tape feeding control section 91 and interval calculating section 96.

Control device 59 rotation-drives th first sprocket 61a faster than the beginning to pitch-feed the carrier tape Tc (step S6 of FIG. 6), detects a light amount of carrier tape Tc for each pitch-feeding (step S7 of FIG. 6), and when a light amount of the empty cavity Ct is detected (step S8 of FIG. 6), a threshold of a light amount is determined based on the detected light amount (step S9 of FIG. 6).

Specifically, tape feeding control section 91 rotation-drives first gear motor 62a faster to feed carrier tape Tc, for example, by a feeding amount of Pc/2, which is one half of the pitch Pc of the cavity Ct, when a determination signal of the tape reference position is input from reference position determination section 95. Threshold determination section 97 inputs the detected light amount of carrier tape Tc for each pitch-feeding from light amount detection section 93, and reads the threshold Lb of the light amount corresponding to the light amount Lc from memory section 99 when the light amount Lc of the empty cavity Ct is input.

Control device 59 acquires a detection cycle of the light amount of the empty cavity Ct (step S10 of FIG. 6), acquires the pitch Pc of the cavity Ct based on the detection cycle, and stores the pitch Pc in memory section 99 (step S11 of FIG. 6).

Specifically, interval calculating section 96 inputs the detected light amount of carrier tape Tc for each pitch-feeding from light amount detection section 93, and acquires the detection cycle of the light amount Lc of the empty cavity Ct when the reference position is input from reference position determination section 95. Then, the interval calculating section 96 acquires the detection cycle of the light amount Lc of the empty cavity Ct and the pitch Pc of the cavity Ct from the feeding pitch of the carrier tape Tc and stores them in memory section 99.

Control device 59 rotation-drives first sprocket 61a even faster to pitch-feed carrier tape Tc (Step S12 of FIG. 6) when the pitch Pc of the cavity Ct is acquired. When a light amount smaller than the selected threshold Lb of the light amount is detected, control device 59 determines whether the detected light amount is consecutively detected (step S13 of FIG. 6). In a case where the detected light amount is consecutively detected, control device 59 determines that the initially detected cavities Ct are cavities Ct accommodating components, and acquires the initial positions of the cavities Ct accommodating the components and stores them in memory section 99 (step S14 of FIG. 6).

Specifically, tape feeding control section 91 rotation-drives first gear motor 62a faster to feed carrier tape Tc, for example, by a feeding amount of Pc, which is the pitch Pc of the cavity Ct, when a calculation completion signal of the pitch Pc of the cavity Ct is input from interval calculating section 96. Component detection section 98 keeps inputting the detected light amount of the carrier tape Tc for each pitch-feeding from light amount detection section 93, determines the initially detected cavities Ct as the cavities Ct accommodating components when a light amount smaller than the selected threshold Lb of the light amount is consecutively detected, acquires the initial positions of the cavities Ct accommodating components from the pitch Pc of the cavity Ct and stores them in memory section 99. With the processing described above, the automatic detection operation for the tape is completed.

Thereafter, control device 59 positions the cut portion of carrier tape Tc at the cutting position based on the stored initial positions of the cavities Ct accommodating the components and pitch Pc of cavity Ct and performs splicing operation which includes cutting, taking in, and bonding.

Effects

The automatic detection device for tape of the disclosure includes tape feeding devices 50 and 51 that feed carrier tapes Tc, in which cavities Ct for component accommodation are provided at a regular interval Pc and which has multiple empty cavities Ct on the leading end side, at a predetermined pitch, and that have the multiple origin positions (positions of the multiple first and second teeth 67a and 67b) at the interval Pc that are equal to or larger than the predetermined pitch, origin position detection devices 63a and 63b that detect the multiple origin positions of tape feeding devices 50 and 51, respectively, light amount detection devices 52 and 53 that cause light to be transmitted through carrier tapes Tc and detect the transmitted light amounts, and leading end detection section 94 that detects the leading ends Th of carrier tapes Tc fed by tape feeding devices 50 and 51 based on the detected light amounts from light amount detection devices 52 and 53. The automatic detection device for tape further includes reference position determination section 95 that determines the tape reference positions (positions of the feeding holes Hcd0)), which are in a fixed positional relationship with the first origin positions, based on the first positions of tape feeding devices 50 and 51 when the leading ends of carrier tapes Tc are detected by leading end detection section 94 (position at which the first tooth 67ad1 is rotated by a distance of Pc/4 after being detected by first origin position detection device 63a) and the first origin positions of tape feeding devices 50 and 51 immediately before leading end detection by leading end detection section 94 (position at which the first tooth 67ad1 is detected by the first origin position detection device 63a), and interval calculating section 96 that calculates the interval between cavities Ct based on the detection cycle of the empty cavity Ct from light amount detection devices 52 and 53 after reference position determination section 95 determines the tape reference positions.

In the automatic detection device for tape, the interval between cavities Ct can be simply acquired since the reference positions of carrier tapes Tc, which are in a fixed positional relationship with the first origin positions of tape feeding devices 50 and 51, are determined and then the interval between the cavities Ct is calculated by performing light amount detection. Therefore, the cycle time in automatic splicing device 20, to which the automatic detection device for tape is applied, is reduced and production efficiency is improved.

In addition, reference position determination section 95 can easily determine the tape reference positions since the tape reference positions are determined based on the first positions of first tape feeding devices 50 and 51, the first origin positions of tape feeding devices 50 and 51, the feeding amounts of carrier tapes Tc from the first origin positions to the first positions, and the interval with the adjacent origin position.

In addition, tape feeding devices 50 and 51 feed the multiple types of carrier tapes Tc and Tcc having different intervals between cavities Ct, and the leading end detection section 94 detects the leading ends of the carrier tapes Tc when the tape feeding devices 50 and 51 feed carrier tapes Tc, out of the multiple types of carrier tapes Tc and Tcc, at a predetermined pitch of Pc/2, which is half of the minimum interval between the cavities Ct. Accordingly, leading end detection section 94 can reliably detect even the leading end of a different type of carrier tape Tc since carrier tape Tc is fed little by little.

In addition, the automatic detection device for tape includes threshold determination section 97 that determines the predetermined threshold La to distinguish empty cavities Ct from nonempty cavities Ct based on the detected light amounts of empty cavities Ct by light amount detection devices 52 and 53. Accordingly, since empty cavities Ct can be distinguished from nonempty cavities Ct based on whether the detected light amounts exceed the threshold La, the cavities Ct accommodating the components e can be reliably detected.

In addition, based on the detected light amounts of empty cavities Ct from light amount detection devices 52 and 53, threshold determination section 97 selects the predetermined threshold La from the multiple thresholds La and Lb set in advance. Accordingly, it is possible to distinguish empty cavities Ct and Ctt from nonempty cavities Ct and Ctt with respect to the multiple types of carrier tapes Tc and Tcc.

In addition, tape feeding devices 50 and 51 set a predetermined pitch, at which the carrier tapes Tc are fed, to a second pitch Pc, which is larger than a first pitch Pc/2 before reference position determination section 95 determines the tape reference positions, after the tape reference positions are positioned at the detection positions of light amount detection devices 52 and 53, and interval calculating section 96 calculates the interval between the cavities Ct when tape feeding devices 50 and 51 feed carrier tapes Tc at the second pitch Pc as a predetermined pitch. Accordingly, the cycle time of tape detection can be improved.

In addition, the automatic detection device for tape includes component detection section 98 that detects that the components e are accommodated in the cavities Ct when a situation in which the detected light amounts from light amount detection devices 52 and 53 are equal to or smaller than the threshold La consecutively occurs after interval calculating section 96 calculates the interval between the cavities Ct. Accordingly, the cavities Ct accommodating the components e can be reliably detected since empty cavities Ct can be determined based on the number of times the detected light amounts exceed the threshold La.

In addition, tape feeding devices 50 and 51 set a predetermined pitch Pc, at which carrier tapes Tc are fed, to the calculated interval between cavities Ct after interval calculating section 96 calculates the interval between cavities Ct, and component detection section 98 detects accommodation of the components e when tape feeding devices 50 and 51 feed carrier tapes Tc at the interval between cavities Ct as a predetermined pitch Pc. Accordingly, the initial positions of cavities Ct in which components e are accommodated can be simply and reliably acquired.

An automatic detection method for tape of the disclosure includes a tape feeding step of tape feeding devices 50 and 51 that have the multiple origin positions at an interval of a predetermined pitch feeding carrier tapes Tc, in which cavities Ct for component accommodation are provided at the regular interval Pc and which have multiple empty cavities Ct on the leading end side, at a pitch that is equal to or smaller than the predetermined pitch, and a leading end detecting step of detecting the leading ends of carrier tapes Tc fed by tape feeding devices 50 and 51 based on the transmitted light amounts detected by light being transmitted through the carrier tapes Tc. The automatic detection method for the tape further includes a reference position determining step of determining the tape reference positions, which are in a fixed positional relationship with the first origin positions, based on the first positions of tape feeding devices 50 and 51 when the leading ends of the carrier tapes Tc are detected in the leading end detecting step, and the first origin positions of tape feeding devices 50 and 51 immediately before leading end detection in the leading end detecting step, and an interval calculating step of calculating the interval between cavities Ct based on the detection cycle of the transmitted light amounts detected by light being transmitted through empty cavities Ct after the tape reference positions are determined in the reference position determining step. According to this, the same effects as the effects of the aforementioned automatic detection device for tape are achieved.

Other

Although the automatic splicing device has been described as an example of an apparatus to which the automatic detection device for tape is applied in the aforementioned embodiment, the automatic detection device for tape can be applied to, for example, an automatic setting apparatus for tape that automatically sets carrier tape in a tape feeder. That is, the automatic detection device for tape is applied when automatically pulling out carrier tape that is wound around the reel mounted on the tape feeder and positioning the cavities accommodating the components on the leading end of the carrier tape at the component supply position of the tape feeder. Below, an outline of the automatic setting apparatus for tape is described.

Figure 11:
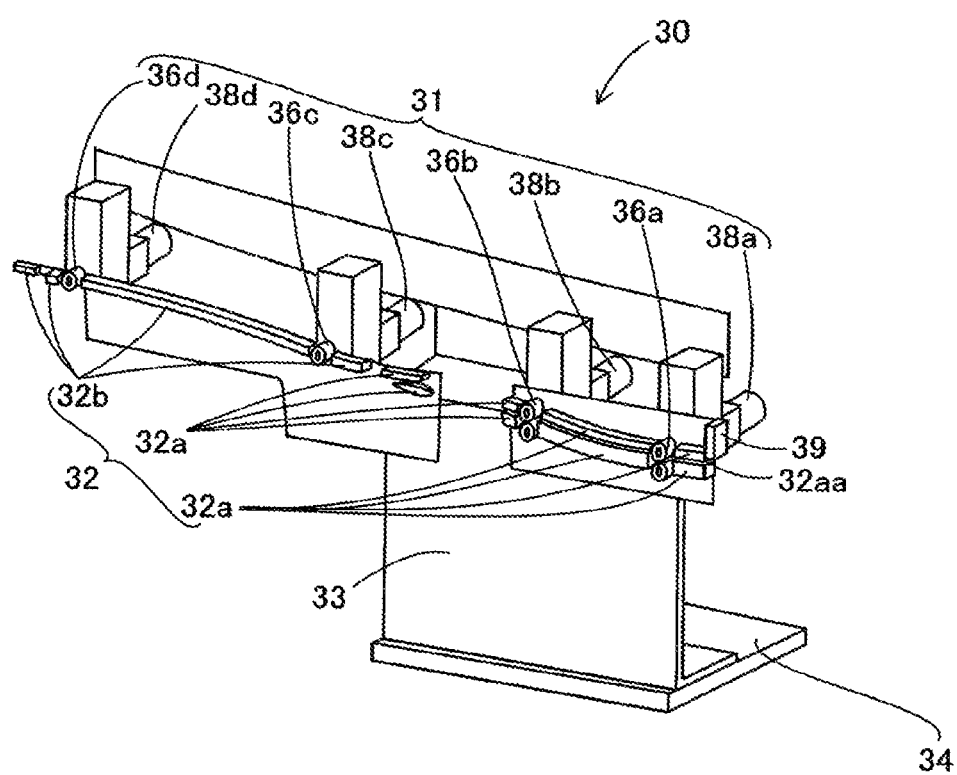
FIG. 11 is a perspective view illustrating an entire automatic setting apparatus for a tape to which the automatic detection device for tape of the embodiment is applied.

As illustrated in FIG. 11, an automatic setting apparatus for tape 30 is provided with feeding device 31 that conveys carrier tape Tc pulled out from reel 11, guide 32 that guides the conveyed carrier tape Tc, supporting board 33 that supports feeding device 31 and guide 32, and seat 34 on which supporting board 33 is placed and fixed. An operator inserts feeding device 31 and guide 32 into tape feeder 10 held by a feeder holding stand (not illustrated). Then, the carrier tape Tc is pulled out from reel 11 of tape feeder 10 and the leading end of the carrier tape Tc is brought to tape entrance 32a a of guides 32a.

When sensor 39 detects the leading end of the carrier tape Tc, each of gear motors 38a, 38b, 38c, and 38d and a motor of tape feeder 10 start to be driven and each of drive rollers 36a, 36b, 36c, and 36d and sprocket 14 of tape feeder 10 start to be rotated. Then, when the operator puts the leading end of the carrier tape Tc into tape entrance 32a a of guides 32a, the carrier tape Tc is fed by each of drive rollers 36a, 36b, 36c, and 36d and is guided by guides 32a and 32b. At this time, the cavities Ct accommodating the components on the leading end of the carrier tape Tc are detected by the automatic detection device for tape, and the cavities Ct accommodating the components are positioned at component supply position 12 of tape feeder 10.

INDUSTRIAL APPLICABILITY

The automatic detection device for tape of the disclosure is applicable to an apparatus that automatically detects information of tape and automatically positions the tape at a predetermined position.

REFERENCE SIGNS LIST

20: automatic splicing device, 50: first tape feeding device, 51: second tape feeding device, 63a: first origin position detection device, 63b: second origin position detection device, 52: first light amount detection device, 53: second light amount detection device, 59: control device, 94: leading end detection section, 95: reference position determination section, 96: interval calculating section, 97: threshold determination section, 98: component detection section

The invention claimed is:

1. An automatic detection device for tape comprising:
a tape feeding mechanism that feeds the tape, in which cavities for component accommodation are provided at a regular interval and which has multiple empty cavities on a leading end side, at a predetermined pitch, the tape feeding mechanism including a tape feeding sprocket having multiple origin positions at an interval which is equal to or larger than the predetermined pitch;
an origin position sensor to detect each of the multiple origin positions of the tape feeding mechanism;
a light amount detector to transmit light through the tape and detect a transmitted light amount;
a leading end detector to detect a leading end of the tape fed by the tape feeding mechanism based on a detected light amount from the light amount detector;
a reference position determination circuitry to determine a tape reference position, which is in a fixed positional relationship with a first origin position of the tape feeding mechanism detected by the origin position sensor, based on (a) a first position of the tape feeding mechanism based on the leading end detector detecting the leading end of the tape and (b) the first origin position of the tape feeding mechanism immediately before the leading end was detected by the leading end detector; and
an interval calculating circuitry to calculate an interval between the cavities based on a detection cycle of the empty cavities by the light amount detector after the reference position determination circuitry determines the tape reference position.

2. The automatic detection device for tape according to claim 1,
wherein the reference position determination circuitry determines the tape reference position based on the first position of the tape feeding mechanism, the first origin position of the tape feeding mechanism, a feeding amount of the tape from the first origin position to the first position, and an interval with an adjacent origin position.

3. The automatic detection device for tape according to claim 1,
wherein the tape feeding mechanism is capable of feeding multiple types of tapes having different intervals between the cavities, and
the leading end detector detects the leading end of the tape, out of the multiple types of tapes, in a case in which the tape feeding mechanism feeds the tape at a half of a minimum interval between the cavities as the predetermined pitch.

4. The automatic detection device for tape according to claim 1, further comprising:
a threshold determination circuitry to determine a predetermined threshold to distinguish the empty cavities from nonempty cavities based on detected light amounts of the empty cavities from the light amount detector.

5. The automatic detection device for tape according to claim 4,
wherein the threshold determination circuitry selects the predetermined threshold from multiple thresholds set in advance based on the detected light amounts of the empty cavities from the light amount detector.

6. The automatic detection device for tape according to claim 5, further comprising:
a component detector to detect that a component is accommodated in the cavity in a case in which a phenomenon, in which the detected light amount from the light amount detector is equal to or smaller than the threshold, consecutively occurs after the interval calculating circuitry calculates the interval between the cavities.

7. The automatic detection device for tape according to claim 6,
wherein the tape feeding mechanism sets the predetermined pitch, at which the tape is fed, to the calculated interval between the cavities after the interval calculating circuitry calculates the interval between the cavities, and
the component detector detects accommodation of the component in a case in which the tape feeding mechanism feeds the tape at the interval between the cavities as the predetermined pitch.

8. The automatic detection device for tape according to claim 1,
wherein the tape feeding mechanism sets the predetermined pitch, at which the tape is fed, to a second pitch, which is larger than a first pitch before the reference position determination circuitry determines the tape reference position, after the tape reference position is positioned at a detection position of the light amount detector, and
the interval calculating circuitry calculates the interval between the cavities in a case in which the tape feeding mechanism feeds the tape at the second pitch as the predetermined pitch.

9. An automatic detection method for a tape, comprising:
a tape feeding step of feeding a tape, in which cavities for component accommodation are provided at a regular interval and which has multiple empty cavities on a leading end side, by a tape feeding mechanism including a tape feeding sprocket that has multiple origin positions at an interval of a predetermined pitch, at a pitch which is equal to or smaller than the predetermined pitch;
a leading end detecting step of detecting a leading end of the tape fed by the tape feeding mechanism based on a transmitted light amount detected by light being transmitted though the tape;
a reference position determining step of determining a tape reference position, which is in a fixed positional relationship with a first origin position of the tape feeding mechanism using an origin position sensor, based on (a) a first position of the tape feeding mechanism when a leading end of the tape was detected in the leading end detecting step and (b) the first origin position of the tape feeding mechanism immediately before the leading end was detected in the leading end detecting step; and
an interval calculating step of calculating an interval between the cavities based on a detection cycle of transmitted light amounts detected by the light being transmitted through the empty cavities after the tape reference position is determined in the reference position determining step.

* * * * *